United States Patent
Wang

(10) Patent No.: US 8,200,175 B2
(45) Date of Patent: Jun. 12, 2012

(54) EFFICIENCY CONTROLLING MODULE OF POWER AMPLIFIER AND WIRELESS COMMUNICATION DEVICE USING THE SAME

(75) Inventor: Xiao-Dong Wang, Guangdong (CN)

(73) Assignees: Shenzhen Futaihong Precision Industry Co., Ltd., ShenZhen, Guangdong Province (CN); Chi Mei Communication Systems, Inc., Tu-Cheng, New Taipei (TW)

( * ) Notice: Subject to any disclaimer, the term of this patent is extended or adjusted under 35 U.S.C. 154(b) by 330 days.

(21) Appl. No.: 12/575,882

(22) Filed: Oct. 8, 2009

(65) Prior Publication Data

US 2010/0308908 A1 Dec. 9, 2010

(30) Foreign Application Priority Data

Jun. 8, 2009 (CN) .......................... 2009 1 0303053

(51) Int. Cl.
*H01Q 11/12* (2006.01)
*H04B 1/04* (2006.01)
(52) U.S. Cl. ................. 455/127.5; 455/114.2; 455/115.1
(58) Field of Classification Search .... 455/127.1–127.5, 455/114.2, 115.1
See application file for complete search history.

(56) References Cited

U.S. PATENT DOCUMENTS 5,646,578 A * 7/1997 Loh et al. ...................... 330/279

* cited by examiner

*Primary Examiner* — Christian Hannon
(74) *Attorney, Agent, or Firm* — Altis Law Group, Inc.

(57) ABSTRACT

An efficiency controlling module of a power amplifier for wireless communication device includes an attenuator, a filter, and a DC/DC convertor electronically connected in series. The attenuator obtains and attenuates efficiency controlling signals. The filter reduces noise in the efficiency controlling signals. The DC/DC convertor dynamically adjusts an output voltage according to the efficiency controlling signals.

2 Claims, 2 Drawing Sheets

EFFICIENCY CONTROLLING MODULE OF POWER AMPLIFIER AND WIRELESS COMMUNICATION DEVICE USING THE SAME

BACKGROUND

1. Technical Field

The disclosure generally relates to efficiency controlling modules and wireless communication devices using the same, particularly to efficiency controlling modules of a power amplifier and a wireless communication device using the same.

2. Description of Related Art

With developments in wireless communication and information processing technologies, wireless communication devices such as mobile phones and personal digital assistants (PDAs) are now in widespread use. Usually, a common wireless communication device includes a transceiver, a power amplifier, and a power source. The transceiver sends radio frequency (RF) signals to the power amplifier. The power amplifier amplifies the RF signals to insure the strength of the RF signals. The communication device communicates with other wireless communication devices or base station via the amplified radio frequency (RF) signals. The power source provides a working voltage to the power amplifier. However, the working voltage output from the power is commonly an invariable voltage, and cannot change according to the output efficiency of the transceiver. When the output efficiency of the transceiver is low, and the input voltage of the power amplifier is higher than the voltage which it actually needs, the efficiency of the power amplifier will be low.

Therefore, there is room for improvement within the art.

BRIEF DESCRIPTION OF THE DRAWINGS

Many aspects of the efficiency controlling modules of a power amplifier and the wireless communication device using the same can be better understood with reference to the following drawing. The components in the drawings are not necessarily drawn to scale, the emphasis instead being placed upon clearly illustrating the principles of the efficiency controlling modules of a power amplifier and the wireless communication device using the same.

DETAILED DESCRIPTION

Figure 1:
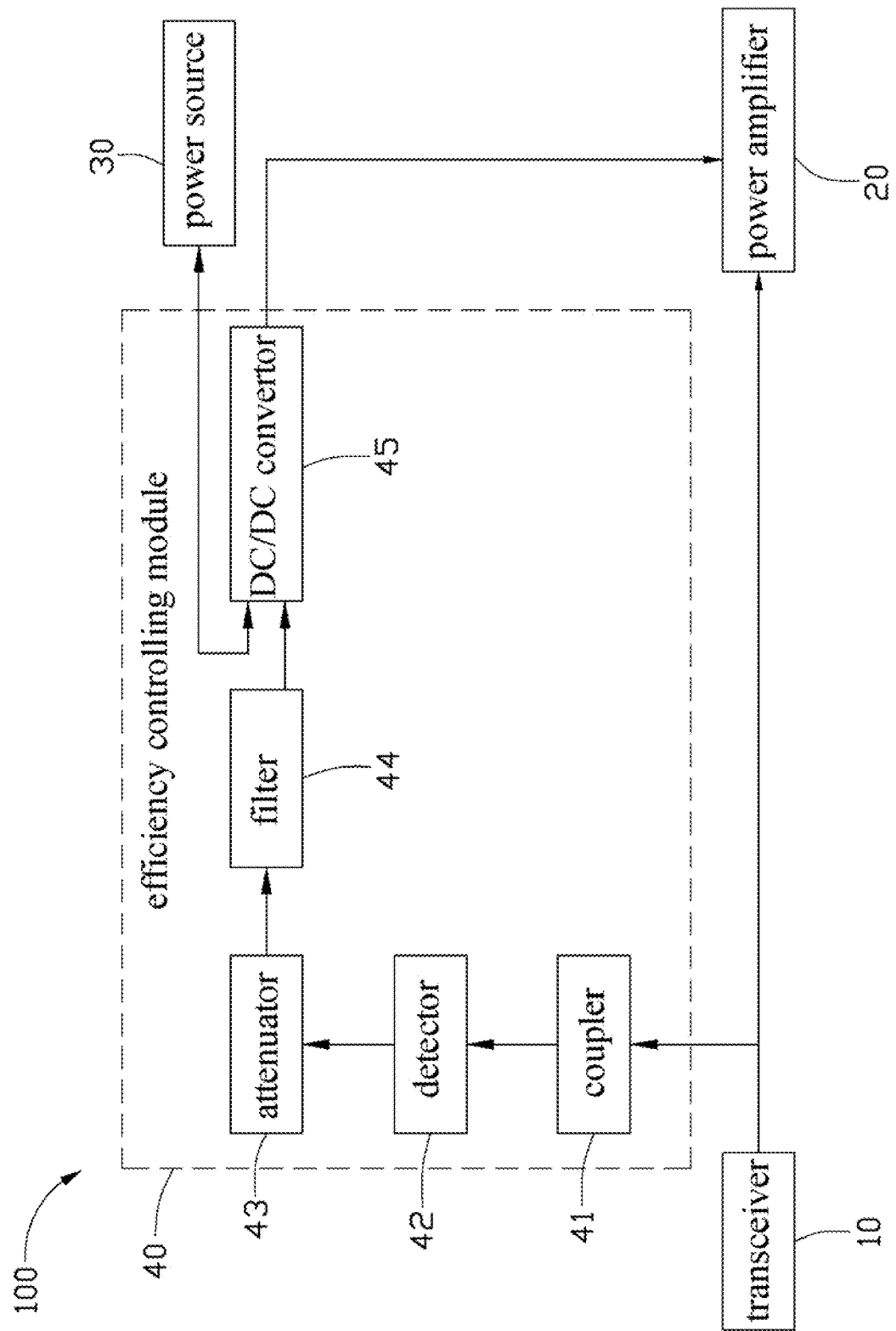
FIG. 1 is a block diagram of a wireless communication device, according to an exemplary embodiment.

Referring to FIG. 1, an exemplary embodiment of a wireless communication device includes a transceiver 10, a power amplifier 20, a power source 30, and an efficiency controlling module 40. The transceiver 10 is electronically connected to the power amplifier 20 by a communication link (not labeled). The power source 30 is electronically connected to the power amplifier 20 through the efficiency controlling module 40. The efficiency controlling module 40 is electronically connected to the communication link between the transceiver 10 and the power amplifier 20.

The transceiver 10 communicates with the power amplifier 20 through the communication link. The transceiver 10 sends radio frequency (RF) signals and efficiency controlling signals to the power amplifier 20. The RF signals communicate with conventional base stations (BS) (not shown). The efficiency controlling signals control the output efficiency of the power amplifier 20. The power amplifier 20 amplifies the received RF signals from the transceiver 10 to enhance the strength of the RF signals. The power source 30 outputs a variable working voltage for the power amplifier 20.

The efficiency controlling module 40 dynamically adjusts the working voltage output from the power source 30 to the power amplifier 20 according to the efficiency controlling signals. The efficiency controlling module 40 includes a coupler 41, a detector 42, an attenuator 43, a filter 44, and a direct current/direct current (DC/DC) convertor 45 electronically connected in series. The coupler 41 is connected to the communication link between the transceiver 10 and the power amplifier 20. The coupler 41 obtains the efficiency controlling signals transmitted from the transceiver 10 to the power amplifier 20, and sends the efficiency controlling signals to the detector 42. The detector 42 converts the efficiency controlling signals into direct current signals, and sends the direct current signals to the attenuator 43.

The attenuator 43 attenuates the direct current signals. The filter 44 reduces noise of the direct current signals. The DC/DC convertor 45 has one end connected to the filter 44 and the power source 30 and another end of the DC/DC convertor 45 connected to the power amplifier 20. The DC/DC convertor 45 dynamically converts the output voltage of the power source 30 to a suitable voltage for the power amplifier 20.

During the process that the transceiver 10 communicates with the power amplifier 20, the efficiency controlling signals tends to weaken when the output efficiency of the transceiver 10 becomes low. Correspondingly, the input voltage to the power amplifier 20 also becomes low. The DC/DC convertor 45 adjusts the voltage output from the power source 30 according to the strength of the efficiency controlling signals to improve the efficiency of the power amplifier 20.

Figure 2:
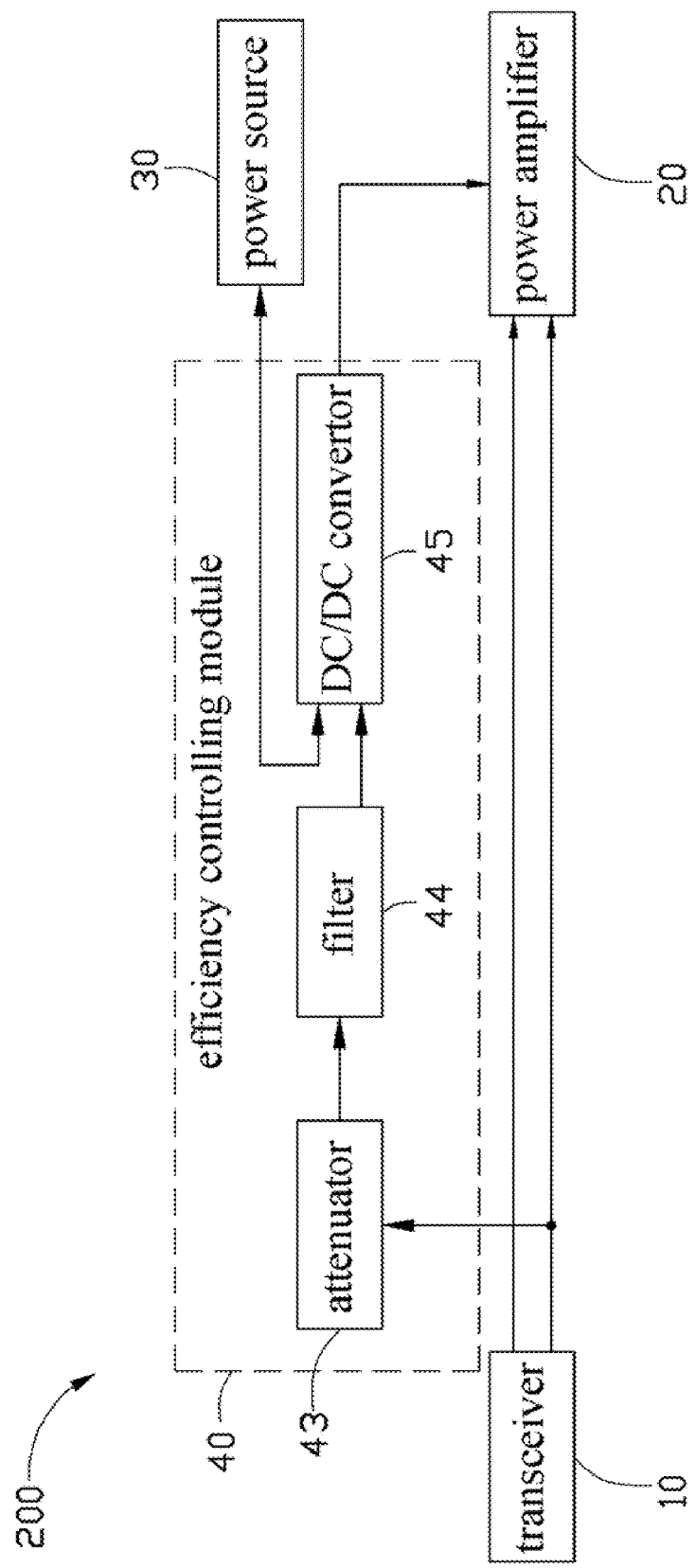
FIG. 2 is a block diagram of a wireless communication device, according to another exemplary embodiment.

In FIG. 2, transceiver 10 communicates with the power amplifier 20 by communication links. The two communication links send the RF signals and the efficiency controlling signals, respectively, and therefore the coupler 41 and the detector 42 can be omitted. The attenuator 43 is connected to the communication link and used to transmit the efficiency controlling signals, and obtains the efficiency controlling signals to adjust the output voltage of the power source 30.

The wireless communication device 100 can dynamically adjusts the input voltage from the power source 30 to the power amplifier 20 according to the efficiency controlling signals. The efficiency of the power amplifier 20 can be improved.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An efficiency controlling module of a power amplifier for wireless communication devices, comprising:
   an attenuator obtaining and attenuating efficiency controlling signals;
   a coupler obtaining efficiency controlling signals from a communication link of the power amplifier;
   a detector, one end of the detector connected to the coupler, another end of the detector connected to the attenuator; the detector converting the efficiency controlling signals into direct current signals and sending the direct current signals to the attenuator;
   a filter reducing noise in the efficiency controlling signals;

a DC/DC convertor; wherein the coupler, the detector, the attenuator, the filter, and the DC/DC convertor are electronically connected in series, the DC/DC convertor dynamically adjusts an output voltage according to the efficiency controlling signals.

2. A wireless communication device, comprising:

a transceiver;

a power amplifier connected to the transceiver by at least one communication link, and receiving efficiency controlling signals and radio frequency signals from the transceiver;

a power source outputting a working voltage to the power amplifier; and an efficiency controlling module, comprising:

an attenuator obtaining and attenuating efficiency controlling signals;

a coupler obtaining efficiency controlling signals from the at least one communication link of the power amplifier;

a detector, one end of the detector connected to the coupler, another end of the detector connected to the attenuator; the detector converting the efficiency controlling signals into direct current signals and sending the direct current signals to the attenuator;

a filter reducing noise in the efficiency controlling signals; and a DC/DC convertor; wherein the coupler, the detector, the attenuator, the filter, and the DC/DC convertor are electronically connected in series, the DC/DC convertor dynamically adjusts the output voltage from the power source to the power amplifier according to the efficiency controlling signals.

* * * * *